US012635259B2

(12) United States Patent
Buchholz et al.

(10) Patent No.: US 12,635,259 B2
(45) Date of Patent: May 19, 2026

(54) INTERDIGITATED BACK CONTACT SOLAR CELL AND METHOD FOR PRODUCING AN INTERDIGITATED BACK CONTACT SOLAR CELL

(71) Applicant: INTERNATIONAL SOLAR ENERGY RESEARCH CENTER KONSTANZ E.V., Constance (DE)

(72) Inventors: Florian Buchholz, Constance (DE); Jan Hoss, Constance (DE); Jonathan Linke, Constance (DE)

(73) Assignee: INTERNATIONAL SOLAR ENERGY RESEARCH CENTER KONSTANZ E.V., Constance (DE)

( * ) Notice: Subject to any disclaimer, the term of this patent is extended or adjusted under 35 U.S.C. 154(b) by 0 days.

(21) Appl. No.: 18/719,428

(22) PCT Filed: Dec. 6, 2022

(86) PCT No.: PCT/EP2022/084565
§ 371 (c)(1),
(2) Date: Jun. 13, 2024

(87) PCT Pub. No.: WO2023/110534
PCT Pub. Date: Jun. 22, 2023

(65) Prior Publication Data
US 2025/0048746 A1 Feb. 6, 2025

(30) Foreign Application Priority Data
Dec. 13, 2021 (EP) ..................................... 21214033

(51) Int. Cl.
| | |
|---|---|
| *H10F 10/14* | (2025.01) |
| *H10F 10/165* | (2025.01) |
| *H10F 77/20* | (2025.01) |

(52) U.S. Cl.
CPC ......... *H10F 10/146* (2025.01); *H10F 10/148* (2025.01); *H10F 10/165* (2025.01); *H10F 77/219* (2025.01)

(58) Field of Classification Search
CPC .... H10F 10/146; H10F 10/148; H10F 10/165; H10F 77/219
See application file for complete search history.

(56) References Cited

U.S. PATENT DOCUMENTS

| | | | |
|---|---|---|---|
| 8,134,217 B2 | 3/2012 | Rim et al. | |
| 8,603,851 B2 | 12/2013 | Lee et al. | |
| (Continued) | | | |

FOREIGN PATENT DOCUMENTS

| | | | | |
|---|---|---|---|---|
| CN | 113284967 A | * | 8/2021 | ......... H10F 77/1226 |
| CN | 113299770 A | | 8/2021 | |
| (Continued) | | | | |

OTHER PUBLICATIONS

Machine translation of KR-20150049211-A, Shim Kyung Jin. (Year: 2015).*

(Continued)

*Primary Examiner* — Mayla Gonzalez Ramos
(74) *Attorney, Agent, or Firm* — Nath, Goldberg & Meyer; Jerald L. Meyer

(57) ABSTRACT

Provided are an interdigitated back contact solar cell (10, *a*, *b*, *c*), comprising a monocrystalline, n-doped wafer (101), a first contact area (40) which is formed by a first stack on the surface of said monocrystalline wafer (101), said first stack comprising a thin silicon oxide layer (201) and a highly n-doped polycrystalline silicon layer (301), and a second contact area (20) which is formed by a second stack on the same surface of said monocrystalline wafer (101) as said first stack, said second stack comprising a thin silicon oxide layer (202) and a highly p-doped polycrystalline silicon (Continued)

layer (701), wherein a p-doped monocrystalline silicon region (801) is located in a gap (30) between said first contact area (40) and said second contact area (20) and a method for producing such an interdigitated back contact solar cell (10, *a, b, c*).

6 Claims, 3 Drawing Sheets

(56)                    References Cited

U.S. PATENT DOCUMENTS

| | | | |
|---|---|---|---|
| 8,790,957 | B2 | 7/2014 | Li et al. |
| 9,196,758 | B2 | 11/2015 | Rim et al. |
| 10,217,880 | B2 | 2/2019 | Cousins |
| 10,658,529 | B2 | 5/2020 | Ji et al. |
| 2009/0308438 | A1 | 12/2009 | De Ceuster et al. |
| 2011/0214719 | A1 | 9/2011 | Li et al. |
| 2015/0162483 | A1 | 6/2015 | Weidman et al. |
| 2019/0019904 | A1 | 1/2019 | Westerberg et al. |
| 2019/0097078 | A1* | 3/2019 | Geerligs .............. H10F 10/146 |
| 2022/0393052 | A1* | 12/2022 | Qiu ...................... H10F 10/166 |
| 2023/0027636 | A1* | 1/2023 | Chen .................... H10F 10/166 |

FOREIGN PATENT DOCUMENTS

| | | | |
|---|---|---|---|
| CN | 113299771 A | 8/2021 | |
| EP | 2980858 A2 | 2/2016 | |
| KR | 20150049211 A * | 5/2015 | .......... H10F 71/121 |
| KR | 1020150049211 A | 5/2015 | |

OTHER PUBLICATIONS

Yang, Guangtao et al., "IBC c-Si solar cells based on ion-implanted poly-silicon passivating contacts", Solar Energy Materials & Solar Cells, 158 (2016) 84-90.

Procel, Paul et al., "Numerical Simulations of IBC Solar Cells Based on Poly-Si Carrier-Selective Passivating Contacts", IEEE Journal of Photovoltaics, IEEE, vol. 9, No. 2, Feb. 18, 2019.

* cited by examiner

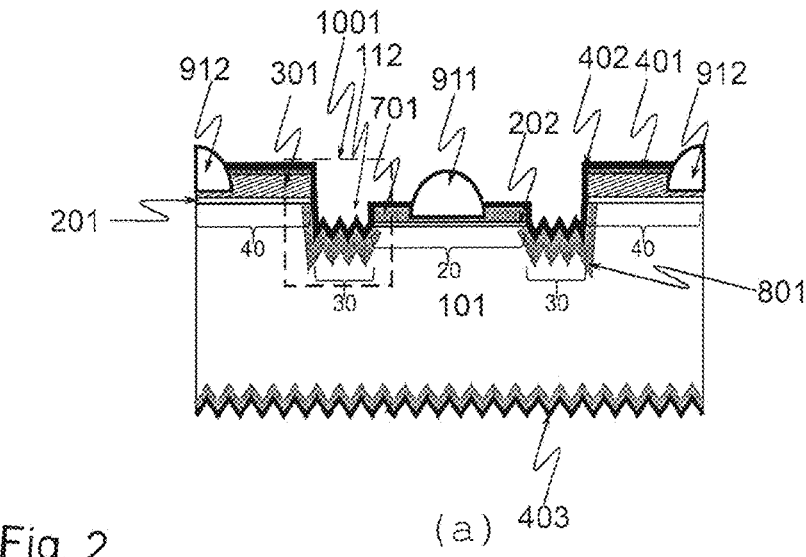
Fig. 2
(a)
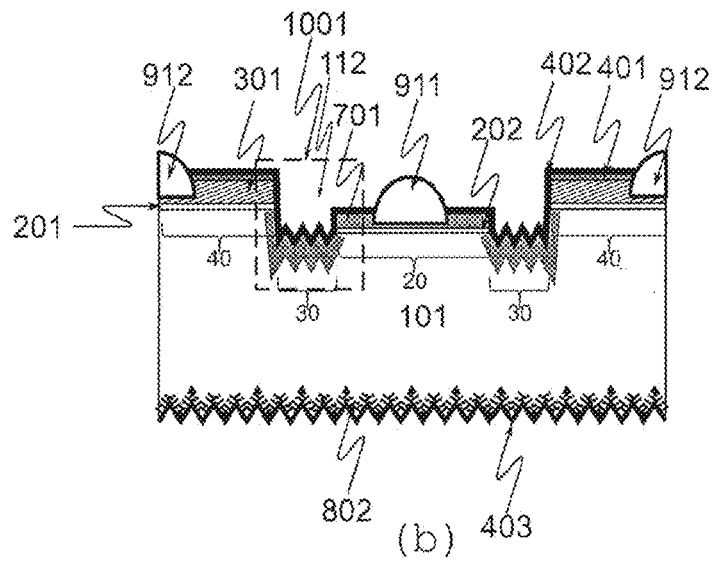
(b)
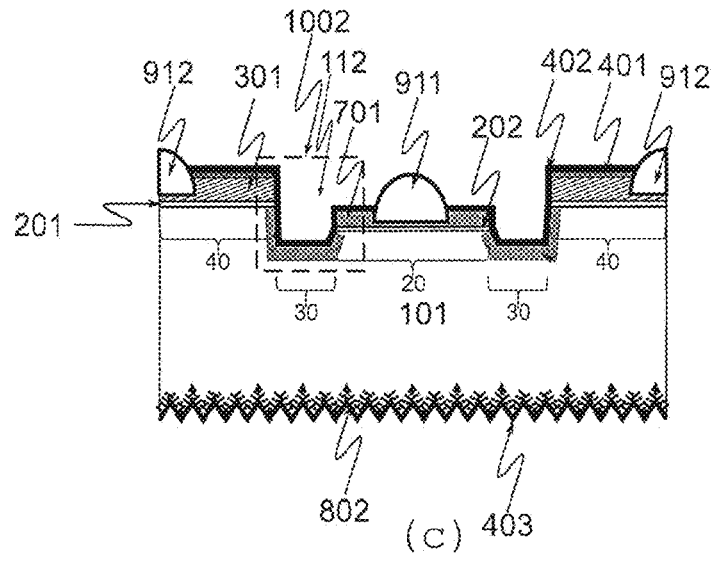
(c)

INTERDIGITATED BACK CONTACT SOLAR CELL AND METHOD FOR PRODUCING AN INTERDIGITATED BACK CONTACT SOLAR CELL

This is a National Phase Application filed under 35 U.S.C. 371 as a national stage of PCT/EP2022/084565, filed Dec. 6, 2022, an application claiming the benefit of European Application No. 21214033.9 filed Dec. 13, 2021, the content of each of which is hereby incorporated by reference in its entirety.

BACKGROUND

"Interdigitated back contact solar cells", known and further on also referred to as IBC solar cells, have the advantage that the solar cell is not shaded on the front side by metal contacts. The n- and p-type doped regions and their respective metal contacts required to separate and utilize the hole and electron pairs generated by the solar irradiation are placed at the backside of the solar cell in an interdigitated fashion leaving the front side completely free from metal contacts. This enables particularly high conversion rates (efficiencies) of light into electricity to be achieved.

A common way of producing the n- and p-type regions in solar cells are homogeneous diffusion processes from gas or liquid phase or solid source creating highly doped regions inside the semiconductor. Alternatively, it has proven to be advantageous to deposit a stack of thin insulation layers with a doped polycrystalline silicon layer on top instead of in-diffusing dopants into the semiconductor obtaining so-called "passivating contacts" or "carrier selective passivating contacts".

According to the so-called TOPCon principle (wherein TOPCon is used as an abbreviation of the term "tunnel-oxide passivated contact"), a thin silicon oxide layer is first produced, on which a layer of highly doped polycrystalline silicon is formed, usually with a dielectric hydrogen-providing amorphous passivation layer on top, onto which the metallization (e.g. by screen printing) is applied according to common methods. This drastically reduces the charge carrier recombination under the metal contacts and significantly increases the solar cell efficiency.

IBC solar cells in accordance with this principle and various methods for their production are well known, e.g. from U.S. Pat. No. 8,790,957 B2, U.S. Pat. No. 9,196,758 B2, U.S. Pat. No. 8,603,851 B2, EP 2 980 858 A2, and U.S. Pat. No. 10,658,529 B2.

Apart from solar efficiency, the behaviour of a solar cell under reverse current conditions is crucial for the solar module performance. If single solar cells within a string of solar cells are shaded, the current of the whole string may set the shaded cells into breakdown condition (reverse bias) and, if the current flows through single weak spots in the diode, hot spot formation may occur. To avoid this, commonly, bypass di-odes are included in the solar module. In case of shading of single cells the whole string is bypassed and is lost for electrical energy generation. IBC solar cells, in particular, when only diffused regions are applied on the rear side, may have so-called "soft break-down behaviour". The breakdown voltage is relatively low and the current flows through the whole area of the cell and thus hot spot formation is avoided. The lower the break down voltage, the lower the dissipated power in form of heat, so that the bypass diode is not required in the circuit of the solar module.

In passivating contact IBC solar cells this bypass-diode-like behaviour has been shown to be implemented in various, more or less complicated ways. As it is known that p+ and n+ polysili-con layers may not touch to avoid recombination currents, how-ever, touching regions of the two polarities can also work as bypass diode. This behaviour is made use of by locally short-circuiting the two polarities in certain regions distributed over the wafer surface, as described in U.S. Pat. No. 7,851,698 B2, thus compromising solar cell efficiency against reverse bias behaviour. Other, more complicated approaches e.g. as demonstrated by the same applicants in U.S. Pat. No. 8,134,217 B2 or U.S. Pat. No. 10,217,880 B2, indicate that good reverse bias behaviour without compromising solar cell efficiency to date requires complicated structures obtained by very complicated processing sequences.

The complicated process sequences that often involve non-standard production equipment make the IBC solar cells premium market products.

SUMMARY

Accordingly, the problem to be solved by this invention is providing a more simple solar cell structure for an IBC solar cell with good reverse bias behavior (low breakdown voltage) that can be fabricated more easily and a method for producing such a solar cell.

This problem is solved by an interdigitated back contact solar cell and a method for producing such a solar cell. The interdigitated back contact solar cell comprises a monocrystalline, n-doped wafer, a first contact area which is formed by a first stack on the surface of said monocrystalline wafer, said first stack comprising a thin silicon oxide layer and a highly n-doped polycrystalline silicon layer, and a second contact area which is formed by a second stack on the same surface of said monocrystalline wafer as said first stack, said second stack comprising a thin silicon oxide layer and a highly p-doped polycrystalline silicon layer. Furthermore, according to the invention there is an additional p-doped monocrystalline silicon region located in a gap between said first contact area and said second contact area.

The thin silicon oxide layer represents a tunneling oxide layer, thus "thin" means typical thicknesses of less than 5 nm. The term "highly doped" is used for layers doped with at least 7E18 atoms/cm3.

The presence of a gap, i.e. a distance in a direction parallel to the surface of the monocrystalline, n-doped wafer, between each part of the first and second contact area, respectively, implies and makes sure that direct contact between n+ doped polysilicon and p+ doped polysilicon is completely avoided. The gap thus prevents the recombination of minority charge carriers where highly n-doped polysilicon (also referred to as n+ polysilicon) touches highly p-doped polysilicon (also referred to as p+ polysilicon) because no such contact is present due to the presence of the gap.

Instead, it induces a charge carrier diffusion barrier, pre-venting parasitic shunting (which would increase the recombination current) but allowing for favorable low voltage break-through. This is the case, because by doping the gap with emitter type, i.e. p-type dopant, the bypass-diode function is achieved as this doping produces the highly n-doped polysilicon—highly p-diffused doping profile in bulk silicon-highly p-doped polysilicon structure. Each of the doped polysilicon regions is contacted by a metallization finger and separated by a p-diffused doped region in the bulk silicon.

Furthermore, the diffusion of emitter type dopant into the gap regions decreases the proportion of electrically shaded, non-doped areas.

Also, the use of the excellent passivating properties of a boron doped high sheet resistance emitter profile created in the gap region eases the needs for highest precision of alignment between the respective structuring processes needed during fabrication of the solar cell.

The second contacting region width may be of smaller width compared to the width of the initially etched trench so that even with a slightly imprecise positioning of the second contacting region, the two contacting regions will not touch. The gap region width in turn can be chosen to be wider than in other state of the art IBC solar cells.

The width of the gap and/or the doped region located therein can preferably be equal or even wider than half of the widths of at least one of the first and second area regions or even wider than both of these widths. A motivation for such wide gap and/or doped region is that the incident light collection efficiency of the rear side of the solar cell is improved, as it widens the regions without polysilicon layers which show strong parasitic absorption of incident light. Thus very high bifaciality factors (rear side light collection efficiency di-vided by front side collection efficiency) can be achieved. Preferably, the entire width of the gap region between the first and second contact area, respectively, is doped in this way, but direct contact between this doped region and the n-doped polysilicon region is not required.

It should be noted that typically, the stacks that form the respective first and second contact area comprise further layers, specifically dielectric layers like $SiN_x$ or $AlO_x/SiN_x$ or $AlO_x/SiO_xN_y$ and metal contacts. Still, the term contact area is used in this description for a respective region of the wafer as soon as the thin silicon oxide layer and the highly doped polysilicon layer are present.

Whereas in principle this gap may be a filled gap or a partly filled gap in which other material is arranged that does not belong either of the first contact area and the second contact area, in a preferred embodiment of the interdigitated back contact solar cell, the gap is formed by a trench, which means that the level of the surface of the interdigitated solar cell is lower in the region of the gap than in other regions of the solar cell, especially the first and second contact area.

This arrangement is favorable from a processing point of view, as it allows for creation of the gap by removal of layers that are applied to the surface of the wafer to create the first and/or second contact area. In this embodiment, the additional p-doped monocrystalline silicon region in the gap is formed in parts of the monocrystalline silicon wafer that form the side and bottom walls of the trench, preferably in the entire side and bottom walls of the trench.

In a preferred variant of this embodiment, the height of the opposite side walls of the trench is different. This feature implies that the first contact area and the second contact area, which form these walls, are located at different height. This alternating height of the position of the p+ and n+ layers, which can be adjusted according to the choice of process parameters, allows for separate application of different screen printing layers for each polarity individually.

In another preferred embodiment, the interdigitated back contact solar cell further comprises a p-doped floating emitter on the side of the wafer that is opposite to the side on which the first and second contact areas are located. This floating emitter can be formed simultaneously with the doping of the gap region.

The method for producing such an interdigitated back contact solar cell comprises the steps of creating a first contact area which is formed by a first stack on the surface of a monocrystalline wafer, said first stack comprising a thin silicon oxide layer and a highly n-doped polycrystalline silicon layer, creating a second contact area which is formed by a second stack on the same surface of said monocrystalline wafer as said first stack, said second stack comprising a thin silicon oxide layer and a highly p-doped polycrystalline silicon layer, creating a gap between the said first contact area and said second contact area, and creating a p-doped monocrystalline silicon region located in a gap between said first contact area and said second contact area.

It should be noted that the sequence of execution of these processing steps is not necessarily the order in which they are listed. Specifically, whereas the gap may in principle be created by subsequent removal of an area in which a previously formed first contact area and a previously formed second contact area touch each other, according to a preferred embodiment of the invention after the first contact area has been created, alkaline etching is performed in an area of the surface of the monocrystalline wafer outside of the first contact area but comprising the area in which the second contact area is to be created, so that the thickness of the monocrystalline silicon wafer is reduced in the area where the alkaline etching is performed.

The gap is then formed by a subsequent creation of the second contact area in the region in which alkaline etching has been performed, but at a distance from the first contact area. This can be done e.g. by creation of a local thin silicon oxide tunneling layer, creation of a local poly-silicon layer on top of this tunneling layer and localized doping, as described in the European patent application with application No. 20201147.4, the content of which is incorporated by reference, which localized doping is preferably performed as a localized laser induced doping. The addition of these layers provides the gap which is formed as a trench whose sidewalls that are formed by the first and second contact have a different height due to the local reduction of the thickness of the monocrystalline silicon wafer.

Specifically, in some embodiments of the invention, the second contact area is created by modifying the etching resistance of an intrinsic polycrystalline layer. This can be achieved e.g. by locally diffusing p-dopant into the layer only in a region where the second contact area is to be located to create a local highly doped region, which is not etched in a subsequent alkaline etching step creating a gap region.

Likewise, the step of creating a p-doped monocrystalline silicon region located in a gap between said first contact area and said second contact area can be performed at different stages of the method. E.g., according to one preferred embodiment, when creating the p-doped monocrystalline silicon region located in the gap between said first contact area and said second contact area a front floating emitter structure is created simultaneously, which reduces the number of processing steps and allows for excellent front surface passivation. The front floating emitter structure also eases the need for high purity material, as the lateral transport of minority charge carriers is improved.

Likewise, in another preferred embodiment when creating the p-doped monocrystalline silicon region located in the gap between said first contact areas and said second contact area, the p-doping of the highly p-doped polycrystalline silicon layer of the second contact area is also modified. This can be done, e.g., by applying a tube furnace diffusion to the gap and the non-protected highly p-doped polycrystalline silicon region and allows for the fine-tuning of the polysilicon region dopant profile.

BRIEF DESCRIPTION OF THE DRAWINGS

A specific embodiment of the invention is now discussed based on figures. The figures show:

FIG. 2: three bypass diode functional structures of IBC solar cells according to embodiments of the invention.

DETAILED DESCRIPTION

It should be noted that in the Figures schematic cross sections, which are not to scale, of the solar cells or solar cell precursors, respectively, are displayed with their front side, i.e. the side that is to be facing the sun, pointing down and their back side, i.e. the side that is opposite to the side that is to be facing the sun, is pointing up.

Figure 1:
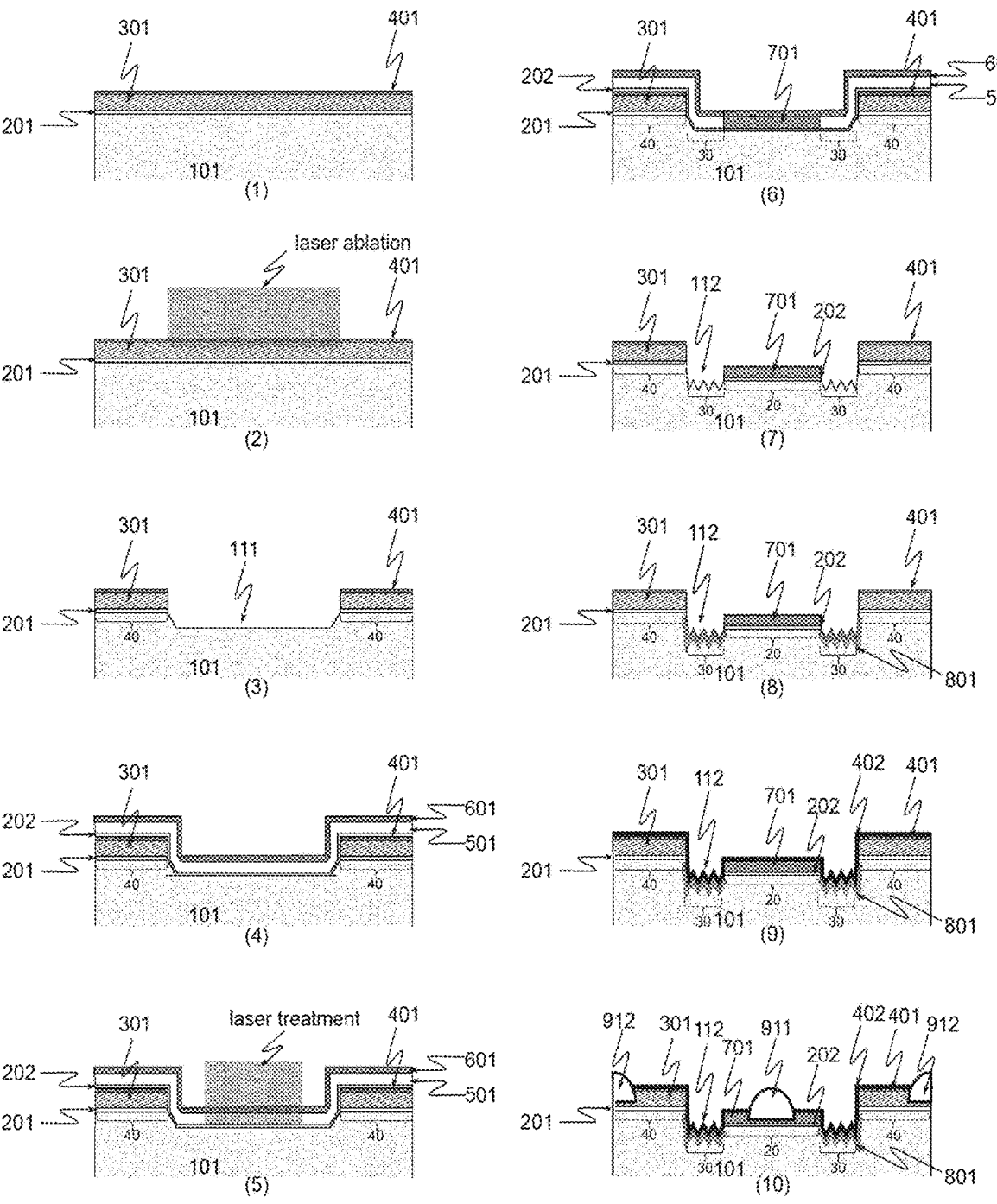
FIG. 1: A possible solar cell processing sequence according to one embodiment of the invention.

Likewise, it should be noted that in FIGS. 1 and 2 only a part of a complete wafer 101 is shown, but only a "unit cell" comprising one second contact area as well of half of each of the two neighboring first contact areas arranged next to it and the gaps separating the first contact areas from the second contact areas. Placing a large number of these unit cells next to each other leads to a corresponding schematic cross section, which is not to scale, through a complete solar cell wafer.

FIG. 1 schematically describes various intermediate stages 1-9 (i.e. solar cell precursors) and the final interdigitated back contact solar cell 10 obtained by one possible embodiment of a method according to the invention.

In this example, the processing of the solar cell according to this invention starts with providing a pre-processed solar wafer 101, typically an n-type mono-crystalline substrate, after saw damage removal and cleaning. Intermediate stage 1 shows this wafer 101 on which a first layer stack, a part of which will be used to form the first contact area, has been deposited on at least one side.

The layer stack consists in this example of a thin thermal silicon oxide layer 201, an n-type amorphous or polycrystalline silicon layer 301 and an etching and diffusion mask 401, e.g. $SiO_x$ or $SiN_x$ deposited by PECVD. Depending on the processing sequence that is applied, at this stage the n-type doping does not yet have to be completed; it is also possible to provide the Si layer and a dopant source layer and drive in the dopant atoms from the dopants source layer at a later point of time.

In the intermediate stage 2, the mask is locally removed. This can be done, as illustrated, by laser ablation, but also in different ways, e.g. by applying a suitable etching paste.

Forming a first trench 111 by alkaline etching leads to intermediate stage 3. In this stage, the first contact areas 10 are already pre-formed.

The intermediate stage 4 is then reached by deposition of a second stack of a thin interface silicon oxide 202, and an intrinsic amorphous or polycrystalline silicon layer 501 with a p+ dopant layer on top 601 on at least the same side of the wafer 101.

This stack which is subsequently treated, as illustrated in intermediate stage 5 by a laser, the width of which is adapted so that the entire laser beam is within the first trench 111, but with a width that is smaller than the width of said trench 111, because the first contact areas 40 and the second contact areas are arranged at different heights.

By doing so, as seen in intermediate stage 6, a highly p-doped polysilicon layer 701 is formed on top of the thin silicon oxide layer 202, thus forming the second contact areas 20 and defining the gaps 30 between first contact areas 40 and second contact areas 20. Well-known alternative methods for localized doping application may also be considered such as masked ion implantation or local screen printing of solid doping layers.

The highly p-doped polysilicon layer 701 is more etch resistant against alkaline solutions compared to the undoped polysilicon layer 501. Therefore, an alkaline solution is then used to remove the non-treated areas including the surface of the first contact area, which leads to the formation of trenches 112 in the gap region 30. The opposing walls of these trenches 112 have a different height. The alkaline solution may also be used to create a textured surface in a second trench 112 and also of the front side of the wafer (not shown).

Next, intermediate stage 8 is created by a diffusion of the same dopant type as used for the polysilicon layer 701 of the second contact areas 20 is employed (e.g. a tube furnace diffusion of $BBr_3$, $BCl_3$ or another type of dopant source for the same type of doping), thus creating a highly p-doped monocrystalline silicon region 801 located in the gaps 30 between said first contact areas 40 and said second contact areas 20 by a homogenous in-diffusion of emitter type dopant into the bulk of wafer 101 that forms the bottom of the trench. This also creates the bypass active area.

At the same time this dopant may also be used to dope the front side of the sample creating a so called front floating emitter structure, which is not shown in intermediate stage 8.

Then at least the back side, but typically both sides of the wafer are coated with dielectric layers e.g. $SiN_x$ or $AlO_x/SiN_x$ 402, leading to intermediate stage 9. Alternatively, a stack of $SiO_x$ in-situ (in the diffusion furnace grown oxide) or separately grown, covered by $SiN_x$ may be used to passivate the surfaces.

The final interdigitated back side contact solar cell 10 also comprises metal contacts 911, 912 on the respective first and second contact areas 40,20. These are typically created by screen printing a metal paste onto these regions and firing. In this context, it is noted that due to the different height of first contact area 40 and second contact area 20, respectively, separate screen printing processes can be used selectively for the respective first and second contact areas 40,20.

In one embodiment of the invention, which is not shown in FIG. 1, the etching and diffusion mask 401 may be removed at one stage in the process flow, preferably after intermediate stage 7 has been reached.

Small alteration in the processing sequence can lead to different embodiments of the invention, such as the inter-digitated back contact solar cells a, b and c that are shown in FIG. 2, using the same reference numerals of FIG. 1 for the various constituent parts of the IBC solar cells.

Specifically, in FIG. 2 the bypass diode functional structure 1001,1002 is indicated by a square with broken lines. Depending on choice of etching medium, the doped surface may textured as in diode functional structure 1001, or flat etched as in diode functional structure 1002 according to known alkaline etching steps.

In the embodiments of the invention shown as FIGS. 2*b* and 2*c*, instead of highly p-doped monocrystalline silicon region 801 (FIG. 2*a*), a front surface field diffusion 802 (of the same type as the base 403) may be employed. To achieve these three variations, additional masking layers or single side treatments may be necessary which are well-known to people skilled in the art.

Also, in FIG. 2 the respective first contact areas 40, second contact areas 20, and gaps 30 are indicated.

Figure 3:
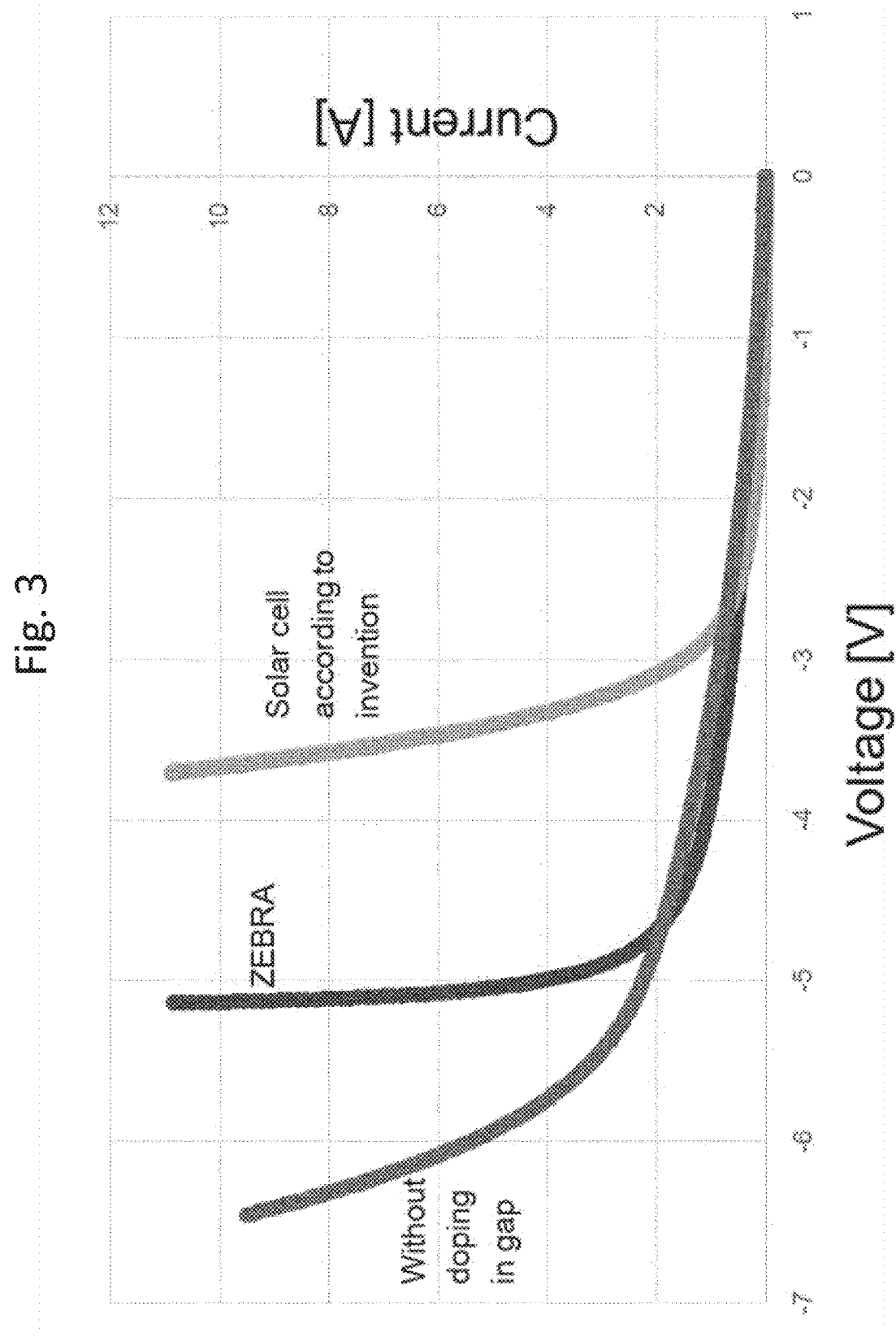
FIG. 3: reverse bias curves of a solar cell according to one embodiment of the invention and reverse bias curves of a homogeneous diffused IBC solar cell (ZEBRA™) and of a solar cell without a doped p+ region in a gap between the two polarity polysilicon regions.

FIG. 3 indicates the superior reverse bias behaviour with a very early breakdown voltage without affecting the shunt resistance (and light IV parameters) of the solar cell according to an embodiment of the invention in comparison of state-of the art homogeneous diffusion based IBC solar cells, specifically a ZEBRA™ solar cell, and a structure with a trench-shaped, but undoped gap between the first and the second contact area.

The invention claimed is:

1. A method for producing an interdigitated back contact solar cell, the interdigitated back solar cell comprising:

a monocrystalline, n-doped wafer (101), a first contact area (40) which is formed by a first stack on the surface of said monocrystalline wafer (101), said first stack comprising a thin silicon oxide layer (201) and a highly n-doped polycrystalline silicon layer (301), and a second contact area (20) which is formed by a second stack on the same surface of said monocrystalline wafer (101) as said first stack, said second stack comprising a thin silicon oxide layer (202) and a highly p-doped polycrystalline silicon layer (701), wherein a p-doped monocrystalline silicon region (801) is located in a gap (30) between said first contact area (40) and said second contact area (20), said method comprising the steps of:

creating a first contact area (40) which is formed by a first stack on the surface of a monocrystalline, n-doped wafer (101), said first stack comprising a thin silicon oxide layer (201) and a highly n-doped polycrystalline silicon layer (301), creating a second contact area (20) which is formed by a second stack on the same surface of said monocrystalline, n-doped wafer (101) as said first stack, said second stack comprising a thin silicon oxide layer (202) and a highly p-doped polycrystalline silicon layer (701), creating a gap (30) between the said first contact area and said second contact area, and creating a p-doped monocrystalline silicon region (801) located in the gap (30) between said first contact area (40) and said second contact area (20), wherein the second contact area (20) is created by modifying the etching resistance of an intrinsic polycrystalline layer by locally diffusing p-dopant into the layer only where the second contact area (20) is to be created to obtain a local highly doped region, which is not etched in a subsequent alkaline etching step creating a gap region (30).

2. A method for producing an interdigitated back contact solar cell, the interdigitated back solar cell comprising:

a monocrystalline, n-doped wafer (101), a first contact area (40) which is formed by a first stack on the surface of said monocrystalline wafer (101), said first stack comprising a thin silicon oxide layer (201) and a highly n-doped polycrystalline silicon layer (301), and a second contact area (20) which is formed by a second stack on the same surface of said monocrystalline wafer (101) as said first stack, said second stack comprising a thin silicon oxide layer (202) and a highly p-doped polycrystalline silicon layer (701), wherein a p-doped monocrystalline silicon region (801) is located in a gap (30) between said first contact area (40) and said second contact area (20), the p-dopant locally diffused into the highly p-doped polycrystalline silicon layer only where the second contact area (20) is created, thereby obtaining a local highly doped region, which is not etched in a subsequent alkaline etching step, thereby creating a gap region (30), said method comprising the steps of:

creating a first contact area (40) which is formed by a first stack on the surface of a monocrystalline, n-doped wafer (101), said first stack comprising a thin silicon oxide layer (201) and a highly n-doped polycrystalline silicon layer (301), creating a second contact area (20) which is formed by a second stack on the same surface of said monocrystalline, n-doped wafer (101) as said first stack, said second stack comprising a thin silicon oxide layer (202) and a highly p-doped polycrystalline silicon layer (701), creating a gap (30) between the said first contact area and said second contact area, creating a p-doped monocrystalline silicon region (801) located in the gap (30) between said first contact area (40) and said second contact area (20), and after the first contact area (40) has been created, alkaline etching is performed in an area of the surface of the monocrystalline, n-doped wafer (101) outside of the first contact area (40) but comprising the area in which the second contact area (20) is to be created, so that the thickness of the monocrystalline, n-doped silicon wafer (101) is reduced in the area where the alkaline etching is performed.

3. The method according to claim 1, characterized in that when creating the p-doped monocrystalline silicon region (801) located in the gap (30) between said first contact area (40) and said second contact area (20), a front floating emitter structure is created simultaneously.

4. The method according to claim 1, characterized in that when creating the p-doped monocrystalline silicon region (801) located in the gap (30) between said first contact area (40) and said second contact area (20), the p-doping of the highly p-doped polycrystalline silicon layer (701) of the second contact area (20) is modified.

5. The method according to claim 2, characterized in that when creating the p-doped monocrystalline silicon region (801) located in the gap (30) between said first contact area (40) and said second contact area (20), a front floating emitter structure is created simultaneously.

6. The method according to claim 2, characterized in that when creating the p-doped monocrystalline silicon region (801) located in the gap (30) between said first contact area (40) and said second contact area (20), the p-doping of the highly p-doped polycrystalline silicon layer (701) of the second contact area (20) is modified.

* * * * *